United States Patent
Kang et al.

(10) Patent No.: US 9,614,119 B2
(45) Date of Patent: Apr. 4, 2017

(54) AVALANCHE PHOTODIODE WITH LOW BREAKDOWN VOLTAGE

(75) Inventors: Yimin Kang, San Jose, CA (US); Han-Din Liu, San Jose, CA (US)

(73) Assignee: INTEL CORPORATION, Santa Clara, CA (US)

( * ) Notice: Subject to any disclaimer, the term of this patent is extended or adjusted under 35 U.S.C. 154(b) by 203 days.

(21) Appl. No.: 13/976,379

(22) PCT Filed: Dec. 29, 2011

(86) PCT No.: PCT/US2011/067934
§ 371 (c)(1),
(2), (4) Date: Jun. 26, 2013

(87) PCT Pub. No.: WO2013/101110
PCT Pub. Date: Jul. 4, 2013

(65) Prior Publication Data
US 2014/0151839 A1  Jun. 5, 2014

(51) Int. Cl.
*H01L 31/107* (2006.01)
*H01L 33/00* (2010.01)
*H01L 31/0352* (2006.01)

(52) U.S. Cl.
CPC .. *H01L 33/0012* (2013.01); *H01L 31/035272* (2013.01); *H01L 31/1075* (2013.01)

(58) Field of Classification Search
CPC ......... H01L 29/66113; H01L 31/02027; H01L 31/107; H01L 31/1075
See application file for complete search history.

(56) References Cited

U.S. PATENT DOCUMENTS

| | | | |
|---|---|---|---|
| 4,083,062 A | 4/1978 | Ohuchi et al. | |
| 6,359,322 B1 | 3/2002 | Haralson et al. | |
| 6,858,829 B2 | 2/2005 | Nishimura et al. | |
| 7,082,248 B1* | 7/2006 | Morse | 385/131 |
| 7,741,657 B2* | 6/2010 | Pauchard et al. | 257/186 |
| 2009/0026494 A1 | 1/2009 | Itzler | |

(Continued)

FOREIGN PATENT DOCUMENTS

TW    201240125 A    10/2012

OTHER PUBLICATIONS

"Monolithic germanium/silicon avalanche photodiodes with 340 GHz gain-bandwidth product" by Yimin Kang et al. in Nature Photonics—Letters, published online Dec. 7, 2008.*

(Continued)

*Primary Examiner* — Eric Ward
(74) *Attorney, Agent, or Firm* — Marger Johnson

(57) ABSTRACT

An Si/Ge SACM avalanche photo-diodes (APD) having low breakdown voltage characteristics includes an absorption region and a multiplication region having various layers of particular thicknesses and doping concentrations. An optical waveguide can guide infrared and/or optical signals or energy into the absorption region. The resulting photo-generated carriers are swept into the i-Si layer and/or multiplication region for avalanche multiplication. The APD has a breakdown bias voltage of well less than 12 V and an operating bandwidth of greater than 10 GHz, and is therefore suitable for use in consumer electronic devices, high speed communication networks, and the like.

24 Claims, 5 Drawing Sheets

(56) References Cited

U.S. PATENT DOCUMENTS

2012/0199932 A1* 8/2012 Bowers .................... 257/438
2012/0326259 A1* 12/2012 Huang et al. ............. 257/438
2014/0217264 A1* 8/2014 Shepard et al. .......... 250/208.1

OTHER PUBLICATIONS

International Search Report and Written Opinion, Sep. 14, 2012, 10 pages, International Application No. PCT/US2011/067934, Korean Intellectual Property Office, Metropolitan City, Korea.

Bowers et al., "High-gain high-sensitivity resonant Ge/Si APD photodetectors," Proc. of SPIE vol. 7660, May 2010, pp-76603H-1-7603H-8.

Ruegg, "An Optimized Avalanche Photodiode," IEEE Transaction on Electron Devices, vol. 14, No. 5, May 1967, pp. 239-251.

* cited by examiner

AVALANCHE PHOTODIODE WITH LOW BREAKDOWN VOLTAGE

GOVERNMENT FUNDING

This invention was made with government support under contract No. HR0011-06-3-0009 and No. H98230-10-9-0021 awarded by the Department of Defense. The government has certain rights in the invention.

TECHNICAL FIELD

Embodiments generally relate to photodiodes, and more particularly, to Silicon/Germanium (Si/Ge) separate absorption, charge and multiplication (SACM) avalanche photodiodes (APDs) having low breakdown voltage characteristics.

BACKGROUND

Avalanche Photodiodes (APD) are mainly used in applications where high sensitivity is desired. Such applications include long haul fiber-optic telecommunication, laser rangefinder, and single photon level detection and imaging, among other applications. SiGe APD offers promising applications targeted at near-infrared optical signals. In a Si/Ge separate absorption, charge and multiplication (SACM) APD, Germanium (Ge) offers high responsivity at near-infrared wavelengths, while Silicon (Si) is used to amplify the generated photocarriers with low noise.

In addition, the applicability of CMOS technology to the fabrication of SiGe based APDs promises reduced prices compared to its III-V APD counterparts. Since APDs have traditionally targeted high-end markets mainly due to higher cost constraints, SiGe APD is a promising candidate for low end markets that require high sensitivity in the near infrared spectrum.

However, reduced price alone is insufficient to realize the widespread application of APDs. The biggest obstacle is the high bias required for the operation of APDs, which in the conventional art operate far beyond the maximum available bias of 12 V found within modern electronics such as server, desktop, and other consumer electronics.

Accordingly, it would be desirable to reduce the operating bias, or breakdown bias, of Si/Ge APDs so that they can be successfully incorporated into consumer electronics, high speed communication networks, and the like.

BRIEF DESCRIPTION OF THE DRAWINGS

Embodiments of the present invention are illustrated by way of example, and not by way of limitation, in the drawings and in which like reference numerals refer to similar elements.

DETAILED DESCRIPTION

Reference will now be made in detail to embodiments of the invention, examples of which are illustrated in the accompanying drawings. In the following detailed description, numerous specific details are set forth to enable a thorough understanding of the present invention. It should be understood, however, that persons having ordinary skill in the art may practice the present invention without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer, without departing from the scope of the present invention.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 1:
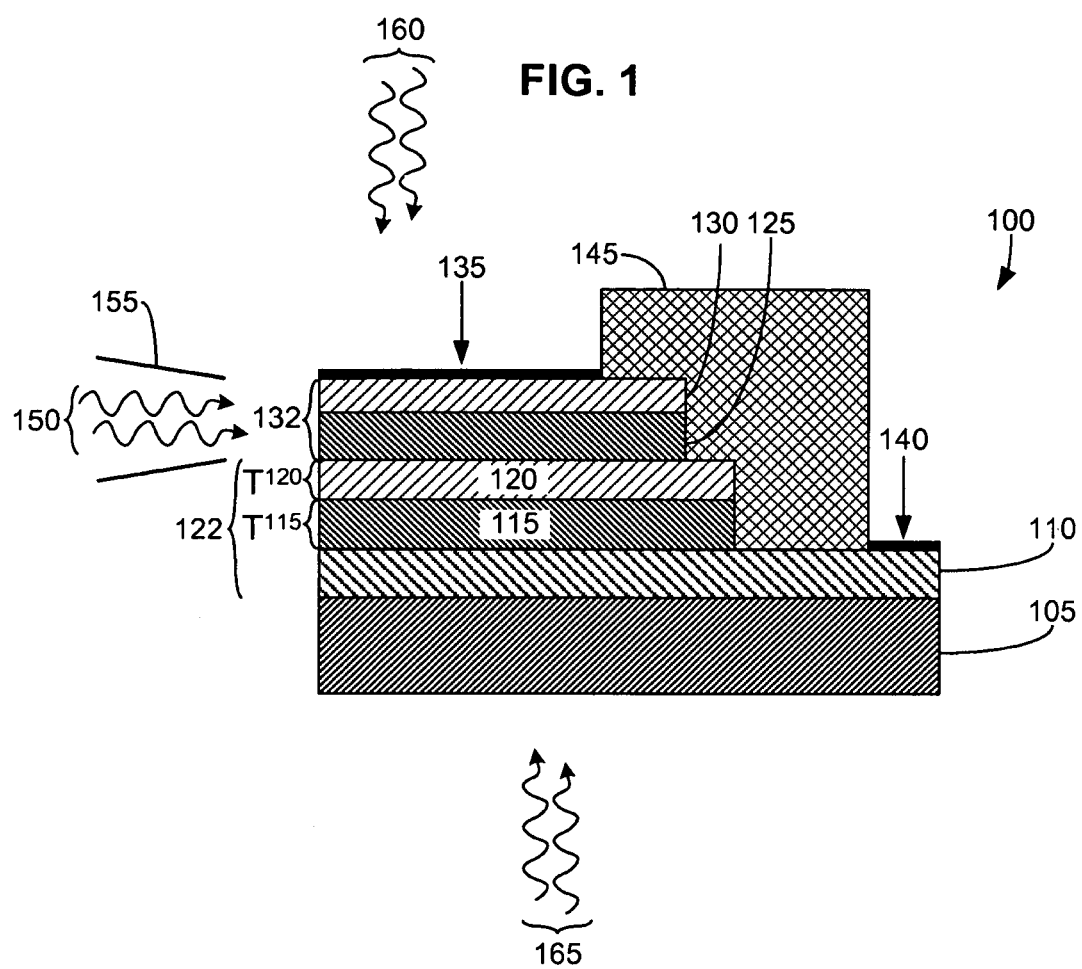
FIG. 1 illustrates a cross-sectional view of an avalanche photodiode (APD) in accordance with embodiments of the present invention.

FIG. 1 illustrates a cross-sectional view of an avalanche photodiode (APD) 100 in accordance with embodiments of the present invention. The APD 100 can be a Si/Ge separate absorption, charge and multiplication (SACM) low voltage avalanche photodiode (LVAPD). For the sake of consistency but not limitation, the avalanche photodiode discussed herein will be referred to simply as the APD 100. It will be understood that the various layers and components of the APD 100 as illustrated are not necessarily drawn to scale, but rather, they are illustrated in such a manner as to clearly show each of the components.

The APD 100 can include a substrate 105. An n-type doped silicon (n$^+$ Si) layer 110 can be disposed on the substrate 105. An intrinsic silicon (i-Si) layer 115 can be disposed on at least a portion of the n$^+$ Si layer 110. Atop the i-Si layer 115, a p-type doped silicon (p Si) layer 120 can be disposed. The n$^+$ Si layer 110, the i-Si layer 115, and the p Si layer 120 can form a carrier multiplication region 122.

In some embodiments, the thickness $T^{120}$ of the p Si layer 120 is 20 nanometers (nm), In some embodiments, the thickness $T^{120}$ of the p Si layer 120 is about 20 nm, or in other words, approximately 20 nm. In some embodiments, the doping concentration of the p Si layer 120 is between $2 \times 10^{18}$ cm$^{-3}$ to $3 \times 10^{18}$ cm$^{-3}$. In some embodiments, the doping concentration of the p Si layer 120 is between about $2 \times 10^{18}$ cm$^{-3}$ to $3 \times 10^{18}$ cm$^{-3}$, or in other words, between approximately $2 \times 10^{18}$ cm$^{-3}$ to $3 \times 10^{18}$ cm$^{-3}$.

In some embodiments, the thickness $T^{115}$ of the i-Si layer 115 is between 0.07 to 0.13 micrometers (μm). In some embodiments, the thickness $T^{115}$ of the i-Si layer 115 is between about 0.07 to 0.13 μm, or in other words, between approximately 0.07 to 0.13 µm. In some embodiments, the thickness $T^{115}$ of the i-Si layer 115 is 100 nm. In some embodiments, the thickness $T^{115}$ of the i-Si layer 115 is about 100 nm, or in other words, approximately 100 nm. In some embodiments, the doping concentration of the i-Si layer 115 is less than $5\times10^{15}$ cm$^{-3}$. In some embodiments, the doping concentration of the i-Si layer 115 is less than about $5\times10^{15}$ cm$^{-3}$, or in other words, less than approximately $5\times10^{15}$ cm$^{-3}$.

An intrinsic germanium (i-Ge) layer 125 can be disposed on at least a portion of the p Si layer 120. A p-type doped silicon (p$^+$ Ge); layer 130 can be disposed on the i-Ge layer 125. The p$^+$ Ge layer 130 and the i-Ge layer 125 can form an absorption region 132. A passivation layer 145 can be disposed on at least a portion of each of the p$^+$ Ge layer 130, the p Si layer 120, and the n$^+$ Si layer 110. A first metal contact 135 can be disposed on the p$^+$ Ge layer 130 and a second metal contact 140 can be disposed on the n$^+$ Si layer 110.

An optical waveguide 155 can guide infrared, near-infrared, and/or optical signals or energy 150 into the absorption region 132. For example, an evanescent or a hybrid of a butt and evanescent coupling of optical signals through the waveguide 155 into the absorption region 132 can be used, particularly for high speed operations. In some embodiments, the incoming infrared and/or optical signals or energy is first collected in the i-Ge layer 125 and/or absorption region 132, and the resulting photo-generated carriers are swept into the i-Si layer 115 and/or multiplication region 122 for avalanche multiplication. Alternatively, or in addition to, the infrared and/or optical signals or energy can be introduced to the APD 100 from the top 160 or from the bottom 165 relative to the layers of the APD 100.

The different doped layers control the APD's internal electric field such that the APD 100 functions correctly. In addition to the approximately 100 nm thick i-Si layer 115, the p Si charge layer 120 can be highly doped and made exceptionally thin, as set forth in detail above, to suppress the APD operating bias below 12 V. The thickness of each of the p$^+$ Ge layer 130, the i-Ge layer 125, the n$^+$ Si layer 110, and the substrate 105 are not as critical, nor do they require a particular specific layer thickness to be operable with the inventive aspects disclosed herein. The thickness and doping concentrations of each of the p Si layer 120 and the i-Si layer 115. are of more importance to achieve the low bias voltage and high performance as described herein.

The APD 100 has associated therewith a breakdown bias voltage. Preferably, the breakdown bias is 8.5 V or thereabout. In some embodiments, the breakdown bias is less than 12 V, or thereabout. The APD 100 also has associated therewith an operating bandwidth. Preferably, the operating bandwidth is 10 GHz, or thereabout. In some embodiments, the operating bandwidth is greater than 8 GHz. In some embodiments, the operating bandwidth is greater than 10 GHz. The simulation, measurement, and performance characteristics of the APD 100 are discussed in further detail below.

Figure 2:
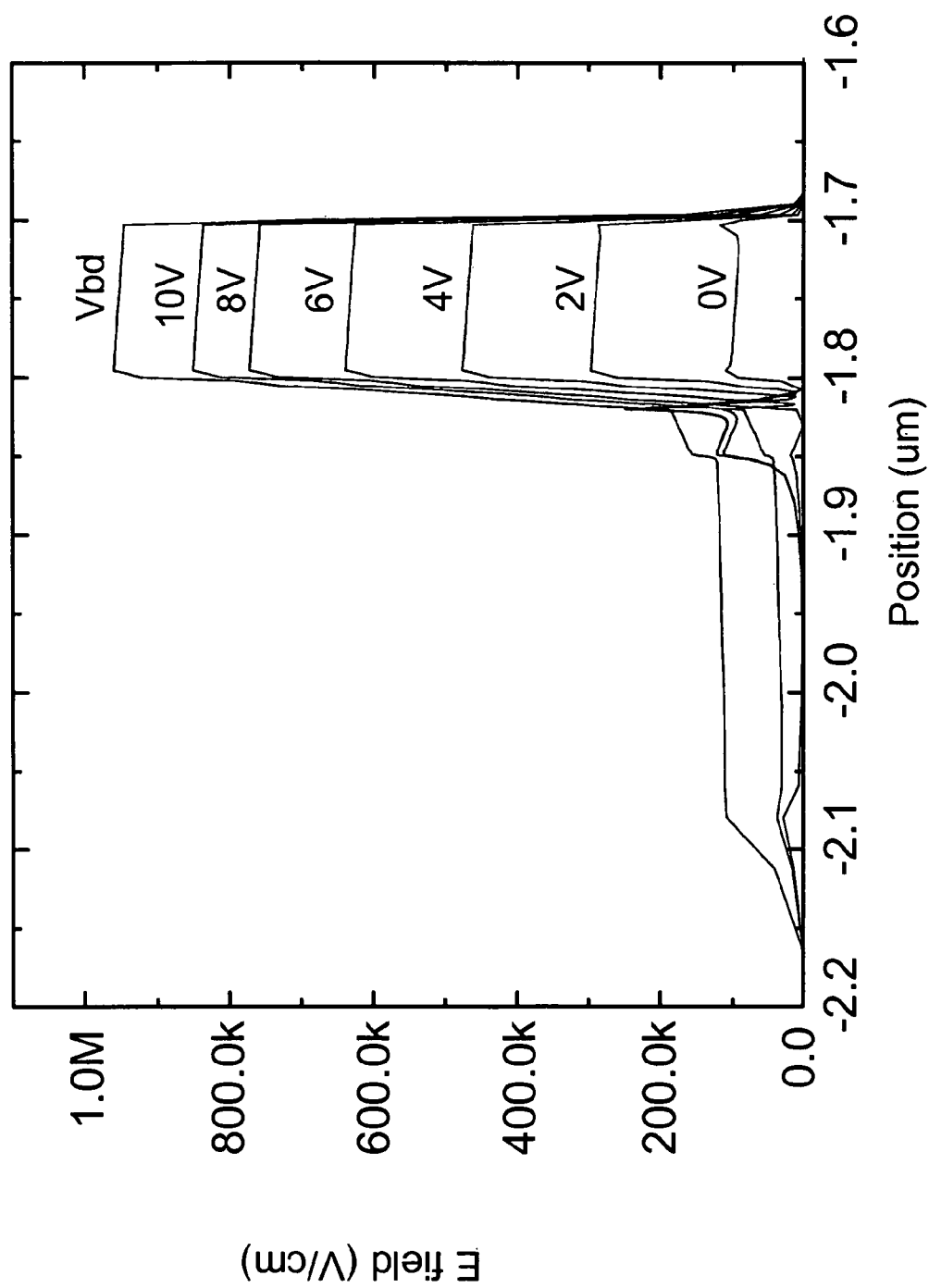
FIG. 2 illustrates a plot of ideal internal electric field distribution of the APD of FIG. 1.

FIG. 2 illustrates a plot of ideal internal electric field distribution of the APD of FIG. 1. Performance aspects such as bandwidth and sensitivity of an APD are dependent on its internal electric field profile or distribution. The electric field within the Ge absorption region 132 ensures that the photo-generated carriers quickly drift out to achieve high bandwidth, but kept sufficiently low to avoid either avalanche multiplication or tanneling within the Ge material. In addition, the high electric field confined within the Si multiplication region 122 provides the avalanche gain to attain high sensitivities. The electric field profile is sensitive and dependent on the doping levels of each layer. For example, the electric field profile is sensitive and dependent on the doping concentration of the p Si layer 120 and the i-Si layer 115, as set forth above.

Figure 3:
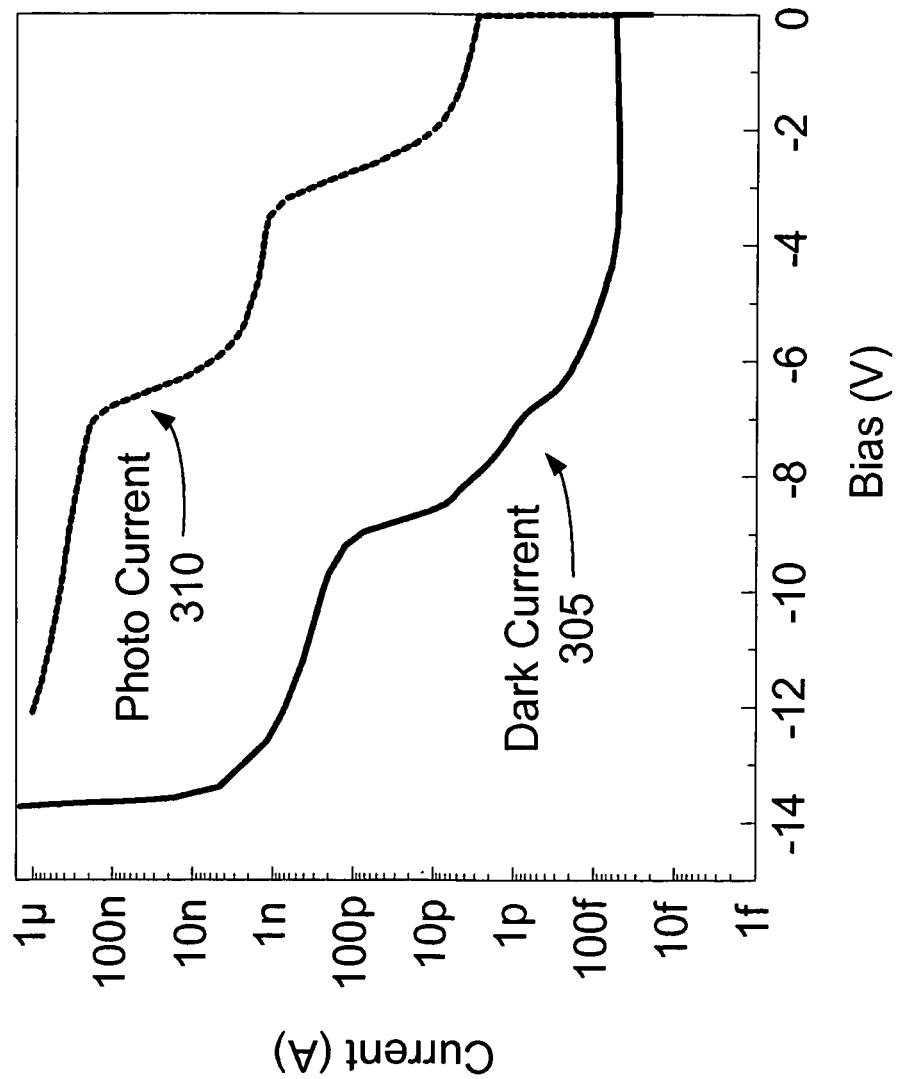
FIG. 3 illustrates a plot of simulated dark current and photocurrent of the APD of FIG. 1.
Figure 4:
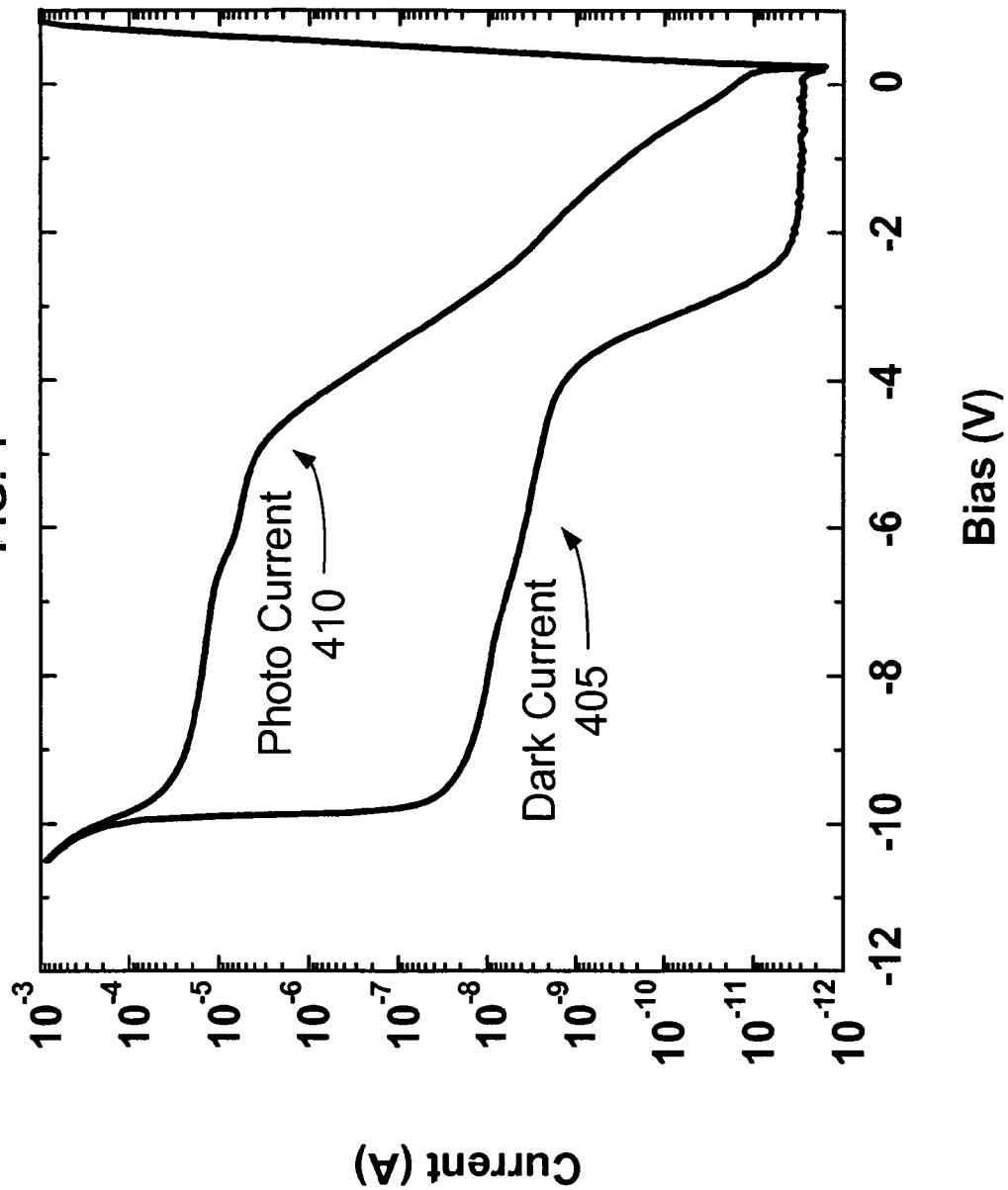
FIG. 4 illustrates a plot of measured dark current and photocurrent of the APD of FIG. 1.

FIG. 3 illustrates a plot of simulated dark current and photocurrent of the APD of FIG. 1. FIG. 4 illustrates a plot of measured dark current and photocurrent of the APD of FIG. 1. Reference is now made to FIGS. 3 and 4.

The dark current (e.g., 305 of FIG. 3 and 405 of FIG. 4) and the photocurrent (e.g., 310 of FIG. 3 and 410 of FIG. 4) is shown in each of the respective plots. The photocurrent corresponds to the APD current under illumination. The results of the simulation can be evaluated and used to determine the preferred or otherwise optimal layer thicknesses and doping concentrations. The measured values confirm the operating characteristics and performance of the APD 100.

Figure 5:
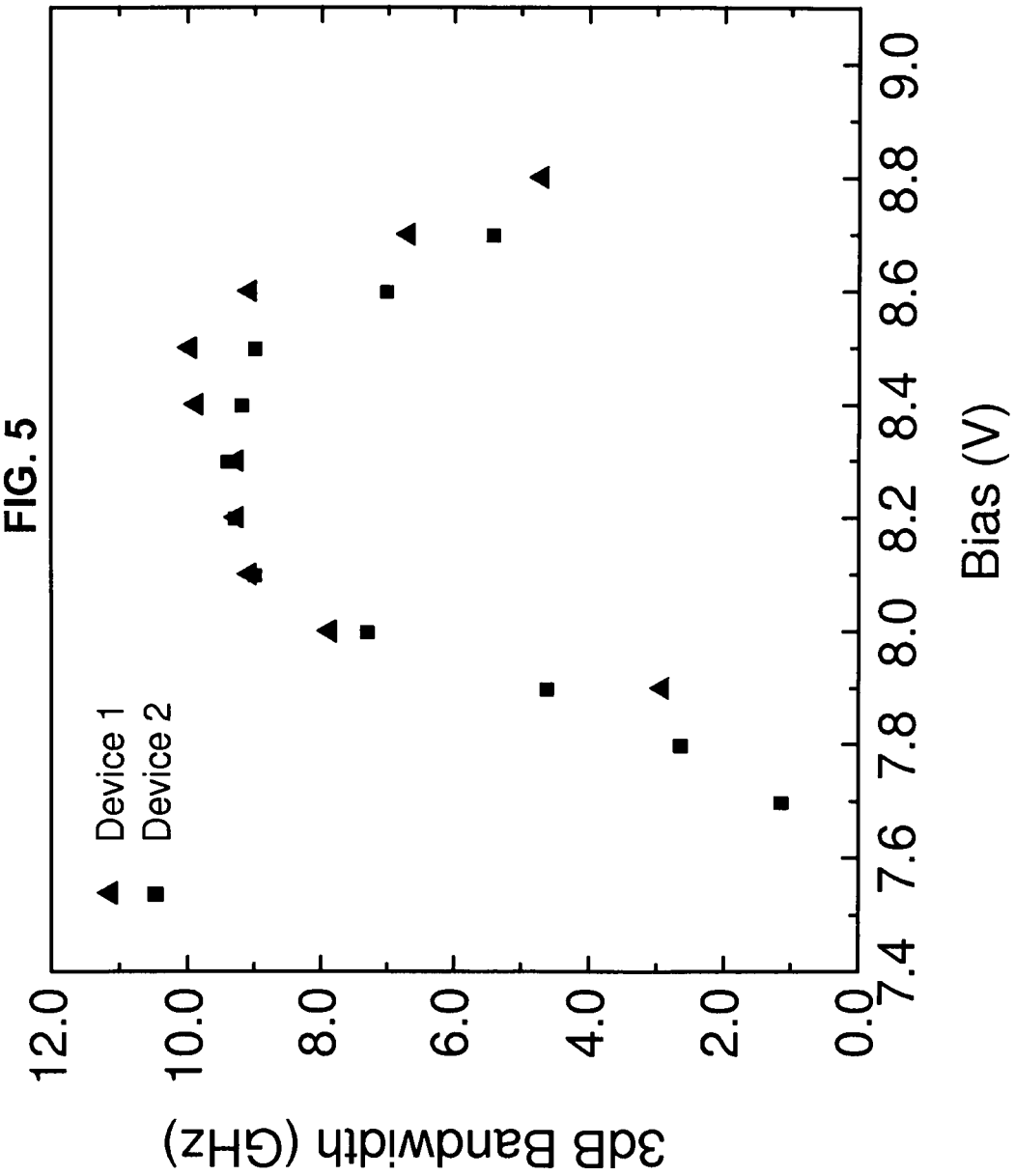
FIG. 5 illustrates a plot of measured bandwidth of two sample APDs in accordance with embodiments of the present invention.

FIG. 5 illustrates a plot of measured bandwidth of two sample APDs in accordance with embodiments of the present invention. The measured breakdown bias, or in other words the operating bias, is about 8.5 V, which is well below the targeted 12 V of consumer electronics. The photoresponse of the APD 100, which is illuminated under 1550 nm laser, can be observed in FIG. 5. The bandwidth measurements show that the APD 100 is capable of operating at bandwidths over 10 GHz, while operating at voltages below 12 V. Embodiments of the APD disclosed herein can be incorporated into applications such as long haul fiber-optic telecommunication, laser rangefinder, and single photon level detection and imaging, among other applications. Moreover, SiGe APD offers promising applications targeted at near-infrared optical signals.

The inventive aspects of the APD 100, as disclosed herein, enables Si/Ge APD technology to be available within consumer electronics, which is a market in which APDs have traditionally had difficulty entering due to operating voltage and cost constraints. The embodiments of the invention disclosed herein can be used in various high speed and high sensitivity optical receiver silicon photonics systems that require low voltage operation.

Although particular embodiments have been described, it will be appreciated that the principles of the invention are not limited to those embodiments. The inventive concepts described herein can be used in high-speed communications systems, for example, including 10 Gbit/s or higher communication networks. The avalanche photodiodes described herein can be included within general purpose computers, tablets, smart phones, ultrabooks, servers, or the like. Embodiments disclosed herein provide compact, high performance, and high frequency response APDs having low breakdown bias characteristics.

Other variations and modifications may be made without departing from the principles of the invention as set forth in the following claims.

What is claimed is:

1. A group-IV semiconductor avalanche photodiode (APD), comprising:
    a substrate;
    an n-type doped silicon (n Si) layer disposed on the substrate;
    an intrinsic silicon (i-Si) layer disposed on a portion of the (n Si) layer;
    a p-type doped silicon (p Si) layer disposed on the i-Si layer;
    an intrinsic germanium (i-Ge) layer disposed on a portion of the p Si layer; and a p-type doped germanium (p Ge) layer disposed on the i-Ge layer,
wherein the thickness of the i-Si layer is between about 0.07 to 0.13 micrometers (μm).

2. The APD of claim 1, wherein the thickness of the p Si layer is about 20 nanometers (nm).

3. The APD of claim 1, wherein the thickness of the i-Si layer is about 100 nm.

4. The APD of claim 1, wherein the doping concentration of the i-Si layer is less than $5 \times 10^{15}$ cm$^{-3}$.

5. The APD of claim 1, wherein the doping concentration of the p Si layer is between about $2 \times 10^{18}$ cm$^{-3}$ to $3 \times 10^{18}$ cm$^{-3}$.

6. The APD of claim 1, further comprising:
a passivation layer disposed on portions of the p Ge layer, the p Si layer, and the n Si layer;
a first metal contact disposed on the p Ge layer; and
a second metal contact disposed on the n Si layer.

7. The APD of claim 1, having associated therewith a breakdown bias less than 12 Volts (V).

8. The APD of claim 7, wherein the breakdown bias is about 8.5 V.

9. The APD of claim 1, having associated therewith an operating bandwidth, wherein the operating bandwidth is about 10 GHz.

10. The APD of claim 1, further comprising:
a breakdown bias of about 8.5 V; and
an operating bandwidth of greater than 8 GHz.

11. The APD of claim 10, wherein the operating bandwidth is greater than 10 GHz.

12. The APD of claim 1, wherein the p Ge layer and the i-Ge layer form an absorption region.

13. The APD of claim 12, further comprising a waveguide configured to guide optical energy into the absorption region.

14. The APD of claim 1, wherein the p Si layer, the i-Si layer, and the n Si layer form a carrier multiplication region.

15. A group-IV semiconductor electronic device, comprising:
circuitry having a predefined operating voltage, the circuitry including an avalanche photodiode (APD), the APD including:
a substrate;
an n-type doped silicon (n Si) layer disposed on the substrate;
an intrinsic silicon (i-Si) layer disposed on a portion of the n Si layer;
a p-type doped silicon (p Si) layer disposed on the i-Si layer;
an intrinsic germanium (i-Ge) layer disposed on a portion of the p Si layer; and
a p-type doped germanium (p Ge) layer disposed on the i-Ge layer,
wherein:
the thickness of the i-Si layer is between about 0.07 to 0.13 micrometers (μm); and
a breakdown bias of the APD is below the operating voltage of the circuitry.

16. The electronic device of claim 15, wherein the predefined operating voltage of the circuitry is 12 V.

17. The electronic device of claim 15, wherein the breakdown bias of the APD is about 8.5 V.

18. The electronic device of claim 15, wherein the thickness of the p Si layer is about 20 nanometers (nm).

19. The electronic device of claim 15, wherein the thickness of the i-Si layer is about 100 nm.

20. The electronic device of claim 15, wherein the doping concentration of the i-Si layer is less than $5 \times 10^{15}$ cm$^{-3}$.

21. The electronic device of claim 15, wherein the doping concentration of the p Si layer is between about $2 \times 10^{18}$ cm$^{-3}$ to $3 \times 10^{18}$ cm$^{-3}$.

22. An avalanche photodiode (APD), comprising:
an intrinsic silicon (i-Si) layer having a thickness of between about 0.07 to 0.13 micrometers (μm) and a doping concentration of less than about $5 \times 10^{15}$ cm$^{-3}$; and
a p-type doped silicon (p Si) layer having a thickness of about 20 nm and a doping concentration of between about $2 \times 10^{18}$ cm$^{-3}$ to $3 \times 10^{18}$ cm$^{-3}$.

23. The APD of claim 22, wherein the p Si layer is disposed on the i-Si layer.

24. The APD of claim 22, wherein the i-Si layer has a thickness of about 100 nanometers (nm).

* * * * *